(12) United States Patent
Lee (10) Patent No.: US 10,069,576 B2
(45) Date of Patent: Sep. 4, 2018

(54) INTERFERENCE SUPPRESSION SYSTEM AND METHOD

(71) Applicants: HONG FU JIN PRECISION INDUSTRY (ShenZhen) CO., LTD, Shenzhen (CN); HON HAI PRECISION INDUSTRY CO., LTD., New Taipei (TW)

(72) Inventor: Yang-Han Lee, New Taipei (TW)

(73) Assignees: HONG FU JIN PRECISION (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/479,239

(22) Filed: Apr. 4, 2017

(65) Prior Publication Data

US 2018/0205467 A1    Jul. 19, 2018

(30) Foreign Application Priority Data

Jan. 14, 2017 (CN) .......................... 2017 1 0026724

(51) Int. Cl.

| | |
|---|---|
| H04B 1/38 | (2015.01) |
| H04L 5/16 | (2006.01) |
| H04B 15/00 | (2006.01) |
| H04B 1/44 | (2006.01) |
| H04B 17/318 | (2015.01) |
| H03F 3/195 | (2006.01) |

(Continued)

(52) U.S. Cl.
CPC ............... *H04B 15/00* (2013.01); *H03F 1/56* (2013.01); *H03F 3/195* (2013.01); *H03F 3/213* (2013.01); *H04B 1/44* (2013.01); *H04B 17/318* (2015.01); *H03F 2200/06* (2013.01); *H03F 2200/09* (2013.01); *H03F 2200/105* (2013.01); *H03F 2200/165* (2013.01); *H03F 2200/222* (2013.01); *H03F 2200/294* (2013.01); *H03F 2200/387* (2013.01); *H03F 2200/451* (2013.01)

(58) Field of Classification Search
USPC ........... 375/297, 296, 219; 455/91, 126, 436
See application file for complete search history.

(56) References Cited

U.S. PATENT DOCUMENTS 5,579,373 A * 11/1996 Jang ...................... H04W 16/02
455/436
5,737,697 A * 4/1998 Yamada ............... H03G 3/3047
330/279

(Continued)

FOREIGN PATENT DOCUMENTS

CN    201947295 U    8/2011

*Primary Examiner* — Wednel Cadeau
(74) *Attorney, Agent, or Firm* — ScienBiziP, P.C.

(57) ABSTRACT

An interference suppression system comprises an antenna, a control module, a receiving and sending module, a radio frequency (RF) sending channel, a power amplifier (PA), a RF receiving channel, a first filter module, and a power detecting module. The control module adjusts the first filter module frequency band to achieve filter feedback to the PA input end. The interference suppression system applies multiple feedbacks to enhance suppression capability, and reduces interference from RF sending channel to RF receiving channel because of PCB signal leakage and mutual interference between this system and adjacent systems.

17 Claims, 4 Drawing Sheets

(51) Int. Cl.
*H03F 3/213* (2006.01)
*H03F 1/56* (2006.01)

(56) References Cited

U.S. PATENT DOCUMENTS

2003/0058048 A1* 3/2003 Ueno ................... H03G 9/16
330/254
2004/0032296 A1* 2/2004 Akaiwa ................ H03F 1/3247
330/149

* cited by examiner

INTERFERENCE SUPPRESSION SYSTEM AND METHOD

CROSS-REFERENCE TO RELATED APPLICATIONS

This application claims priority to Chinese Patent Application No. 201710026724.7 filed on Jan. 14, 2017, the contents of which are incorporated by reference herein.

FIELD

The subject matter herein generally relates to wireless communication field, and particularly to an interference suppression system and method.

BACKGROUND

Wireless frequency bands are crowded, and it becomes a problem how to realize higher transmitting speed with limited frequency band. Different communication systems can be set in one electronic product to improve utility, but the parasitic signal generated by nonlinear characteristic of electronic products can often self-interfere, or cause interference elsewhere. Technicians can use high order filter (such as sixth order filters) to filter interference to solve interference problems in multisystem, but high order filter may result in lower output capability, nor can it solve the self-interference problem. Therefore, a new interference suppression system and method are required.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 1:
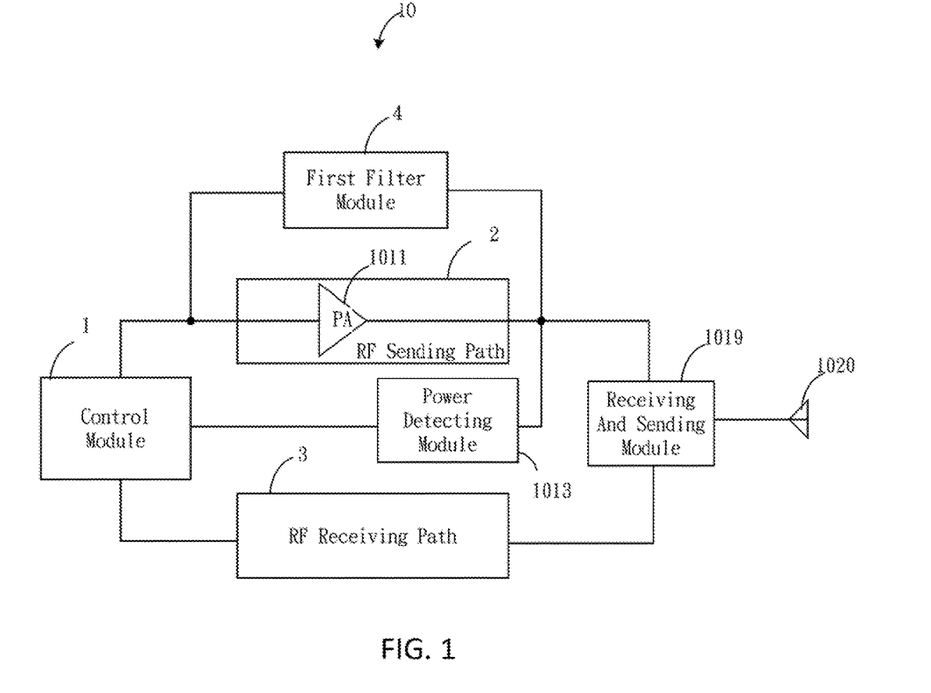
FIG. 1 is a block diagram of an embodiment of an interference suppression system.

FIG. 1 illustrates a first embodiment of an interference suppression system 10. In one embodiment, the interference suppression system 10 comprises a control module 1, a radio frequency (RF) sending channel 2, a receiving and sending module 1019, and at least one antenna 1020, they are successively electrically connected. The RF sending channel 2 comprises a power amplifier (PA) 1011. The PA 1011 with an input end electrically connects to the control module 1, and an output end electrically connects to the receiving and sending module 1019. The control module 1 is configured to control the working of the interference suppression system 10, and can generate and send RF signals. The PA 1011 is configured to amplify power of the RF signal to meet power requirement of RF signal sending. The at least one antenna 1020 is configured to broadcast the amplified RF signal. The interference suppression system 10 further comprises an RF receiving channel 3 electrically connected to the control module 1 and the receiving and sending module 1019. The at least one antenna 1020 is further configured to receive external RF signal. The external RF signal is transmitted to the control module 1 through the RF receiving channel 3, and the control module 1 processes the received RF signal to obtain information. The interference suppression system 10 further comprises a first filter module 4. The first filter module 4 has a first filter module 4 input end electrically connected to the PA 1011 output end, a first filter module 4 output end electrically connected to the PA 1011 input end. and a first filter module 4 control end electrically connected to the control module 1. The interference suppression system 10 further comprises the power detecting module 1013. The power detecting module 1013 electrically connects to the PA 1011 output end and the control module 1, and is configured to detect a first RF sending power. The control module 1 is configured to adjust frequency band of the first filter module 4 according to the first RF sending power. RF signal processed by the first filter module 4 is fed to the PA 1011 input end.

Figure 2:
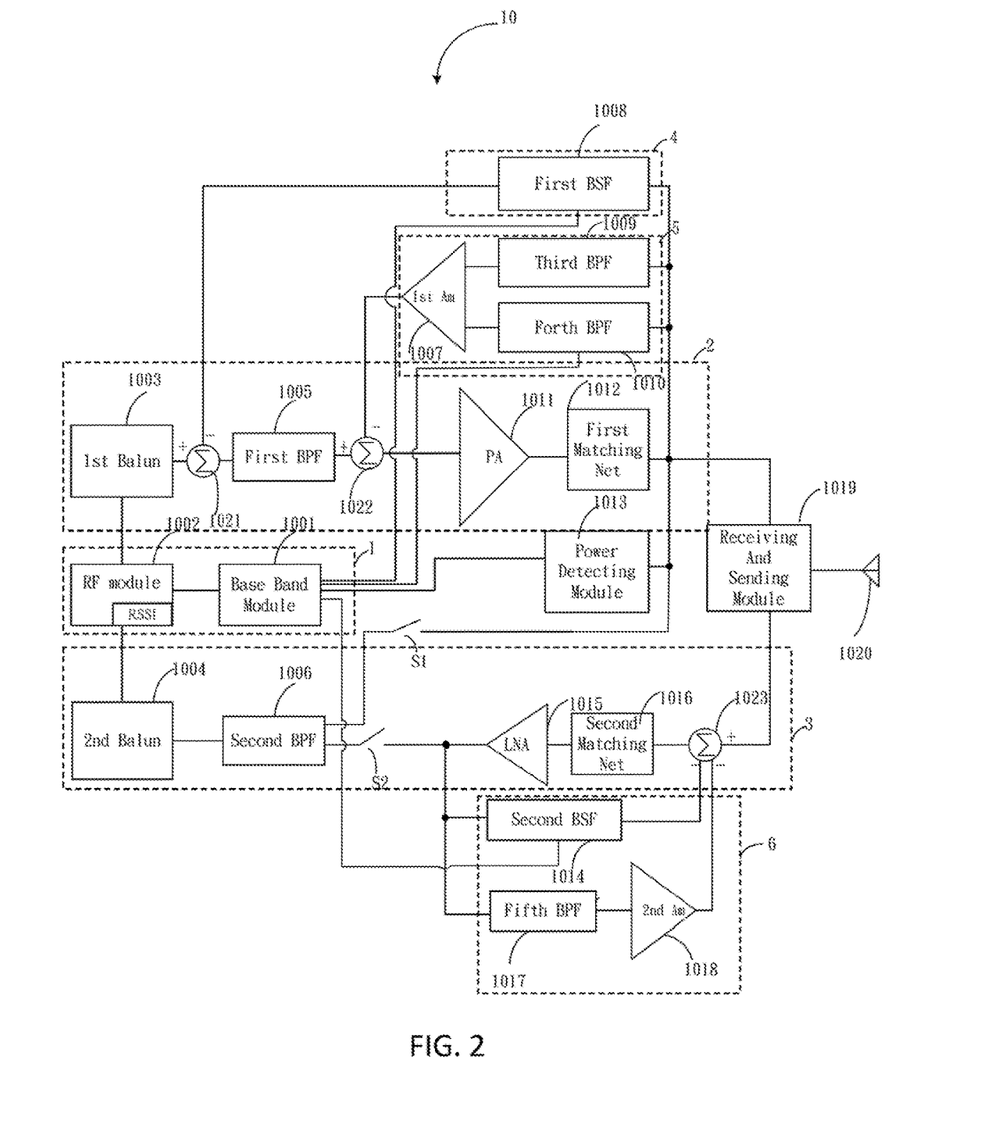
FIG. 2 is a block diagram of another embodiment of an interference suppression system.

FIG. 2 illustrates a second embodiment of an interference suppression system 10. In one embodiment, the interference suppression system 10 comprises a base band module 1001, a RF module 1002, a first balun 1003, a first adder 1021, a first band pass filter (BPF) 1005, a second adder 1022, a PA 1011, a match network 1012, a receiving and sending module 1019, and at least one antenna 1020, and they are in successively electrically connected. In one embodiment, the control module 1 comprises the base band module 1001 and the RF module 1002. RF sending path 2 comprises but is not limited to the first balun 1003, the first adder 1021, the first BPF 1005, the second adder 1022, the PA 1011, and the first match network 1012. The interference suppress system 10 further comprises a second balun 1004, a second BPF 1006, a second switch S2, a low noise amplifier(LNA) 1015, a second match network 1016, and a third adder 1023, and they are in successively electrically connected. The second balun 1004 electrically connects to the RF module 1002, and the third adder 1023 electrically connects to the receiving and sending module 1019. In one embodiment, the at least one antenna 1020 is configured to send/receive electromagnetic wave signal. The electromagnetic wave signal is processed by the receiving and sending module 1019 and transmitted to the RF module 1002 and the base band module 1001 via the RF receiving channel 3. In one embodiment, in 4G LTE (Long Term Evolution) environment, the receiving and sending module 1019 can be duplexer. In other embodiments, the receiving and sending module 1019 can be antenna transceiver switch. In one embodiment, the base band module 1001 can be a base band integrated circuit (BBIC). The base band module 1001 is configured to control the working of the interference suppression system 10 and control the working and calibrating of each element or module. The RF module 1002 can be radio-frequency integrated circuit (RFIC), which is configured to send high frequency signal, receive high frequency signal, transform high frequency signal, or other work of high frequency signal. The first balun 1003 and the second balun 1004 are configured to do impedance conversion, signal transmission match, and so on. The first match network 1012 and the second match network 1016 are configured to do impedance matching.

In one embodiment, the interference suppression system 10 further comprises a power detecting module 1013. The power detecting module 1013 comprises an power detecting end electrically connected between the first match network 1012 and the receiving and sending module 1019, and a power output end electrically connected to the base band module 1001. The power detecting module 1013 is configured to detect sending power of the RF sending path 2. In one embodiment, the power detecting module 1013 is further configured to detect output power of the PA 1011. The RF module 1002 comprises a received signal strength indicator (RSSI) module. In one embodiment, the RSSI module of the RF module 1002 is configured to detect signal strength of RF signal from the RF receiving channel 3. In other embodiments, the RSSI module can be set independently or in other module.

The interference suppression system 10 further comprises a first band stop filter (BSF) 1008, a third BPF 1009, a fourth BPF 1010, and a first amplifier 1007. The first filter module 4 comprises a first BSF 1008, the first BSF 1008 can be adjustable filter which has adjustable working frequency band. Input end of the first BSF 1008 is electrically connected to the receiving and sending module 1019 and output end to the first match network 1012. Output end of the first BSF 1008 is electrically connected to negative end of the first adder 1021. Control end of the first BSF 1008 is electrically connected to the base band module 1001. The first BSF 1008 is configured to stop or reduce interference signal out of particular operating frequency band (POFB). The POFB can be frequency band for RF sending signal of series communication systems. The interference signal can be high order harmonic generated by non-linear devices of the interference suppression system 10.

In one embodiment, the interference suppression system 10 further comprises a second filter module 5, which comprises a third BPF 1009, a fourth BPF 1010, and a first amplifier 1007. The third BPF 1009 and the fourth BPF 1010 are electrically connected to the first amplifier 1007 and output end of the first match network 1012, and output end of the first amplifier 1007 is electrically connected to negative end of second adder 1022. The third BPF 1009 is configured to filter interference from adjacent system(s), for example, when LTE and WIFI are coexisting in electrical device (such as in cellphone, tablet, and so on). WIFI is subject to much interference because frequency band of WIFI is ISM (Industrial Scientific Medical) Band (2.4 GHz). It should be understood that, in other embodiments, various communication systems can coexist in one device such as LTE, WIFI, and BLUETOOTH systems, and so on. In one embodiment, the fourth BPF 1010 can be frequency band adjustable filter, and is configured to filter interference such as RF signal sending end to RF signal receiving end. For example, RF signal from RF signal sending end leaks to RF signal from receiving end, resulting in interference to RF signal receiving end, and in the meantime, the fourth BPF 1010 would filter interference signal from RF signal sending end. The first amplifier 1007 can be gain amplifier, configured to amplify filtered signal from the third BPF 1009 and the fourth BPF 1010. The PA 1011 receives and amplifies filtered signal from the first BSF 1008, the third BPF 1009, and the fourth BPF 1010, to reduce interference. The gain amplification of the first amplifier 1007 enhances suppression capability of each filter.

In one embodiment, the interference suppression system 10 further comprises a third filter module 6. The third filter module 6 comprises a second BSF 1014, a fifth BPF 1017, and a second amplifier 1018. The second BSF 1014 is electrically connected to LNA 1015 output end, the base band module 1001, and the third adder 1023. The second BSF 1014 controlled by the base band module 1001 is configured to filter interference in output signal from the LNA 1015. In one embodiment, the second BSF 1014 can be a frequency band adjustable filter. Output signal of the second BSF 1014 is fed to negative end of the third adder 1023 to reduce interference in received signal of the RF receiving channel 3. The fifth BPF 1017 is electrically connected to the LNA 1015 and input end of the second amplifier 1018, and output end of the second amplifier 1018 is electrically connected to negative end of the third adder 1023. The fifth BPF 1017 receives and processes signal from the LNA 1015 and feeds it to negative end of the third adder 1023. This reduces interference caused by near frequency band from other system, for example, when WIFI or other system is coexisting in same device or set close to LTE, WIFI, or other system. In one embodiment, the fifth BPF 1017 is set to filter interference outside frequency band of LTE. The second amplifier 1018 can be gain amplifier, configured to amplify filtered signal of the fifth BPF 1017 to enhance suppression capability. In one embodiment, feedback form of the first BSF 1008, third BPF 1009, fourth BPF 1010, second BSF 1014, and fifth BPF 1017 can be negative feedback.

In one embodiment, the interference suppression system 10 further comprises a first switch S1 and a second switch S2. The first switch S1 is electrically connected to the second BPF 1006 and output end of the first match network 1012, and the second switch S2 is electrically connected to the second BPF 1006 and output end of the LNA 1015. In one embodiment, the on or off states of the first switch S1 and the second switch S2 are controlled by the base band module 1001. When the first switch S1 is turned on, RF signal from the RF sending channel 2 feeds to the second BPF 1006, specifically, RF signal amplified by the PA 1011 is fed to the second BPF 1006. The second switch S2 is configured to control connection of the second BPF 1006 and the LNA 1015.

In one embodiment, the base band module 1001 can control on-off states of the first switch S1 and the second switch S2, and control the power detecting module 1013 and the RSSI module to detect power. The base band module 1001 further adjusts frequency band of the first BSF filter 1008, fourth BPF 1010, and second BSF 1014 according to power detected by the power detecting module 1013 and the RSSI module, to reduce interference. In this regard, the base band module 1001 turns off the first switch S1 and turns on the second switch S2, and adjusts frequency band of the first BSF 1008 according to sending power of the RF sending channel 2 detected by the power detecting module 1013. Generally, the sending power comprises available signal power and interference signal power. Since the available signal power is known already, when detected power is greater than sum of the available signal power and interference signal power, it may be that the interference signal is too big. In consequence, the base band module 1001 determines whether detected power is less than first preset value; if the detected power is not less than the first preset value, the base band module 1001 continuously adjusts frequency band of the first BSF 1008 until the detected power is less than the first preset value. If the detected power is less than the first preset value, the base band module 1001 turns on the first switch S1, turns off the second switch S2, and the RSSI module detects sending power of the RF sending channel 2. The base band module 1001 adjusts frequency band of the fourth BPF 1010 according to detected power from the RSSI module. The detected power from the RSSI module comprises available signal power and interference signal power, the interference signal herein resulting from PCB (Printed Circuit Board) leakage. The base band module 1001 determines whether the detected power from the RSSI module is less than a second preset value; if the detected power from the RSSI module is not less than the second preset value, the base band module 1001 continuously adjusts frequency band of the fourth BPF 1010 until the detected power from the RSSI module is less than the second preset value. When the detected power from the RSSI module is less than the second preset value, the base band module 1001 turns off the first switch S1 and turns on the second switch S2, and the RSSI module detects receiving power of the RF receiving channel 3. The receiving power comprises available signal power and interference signal power, but neither the available signal power nor the interference signal power is precisely known. Therefore, the base band module 1001 determines whether the receiving power from the RSSI module is greater than a third preset value; if the receiving power from the RSSI module is not greater than the third preset value, the base band module 1001 continuously adjusts frequency band of the second BSF 1014 until the receiving power detected by the RSSI module is greater than the third preset value. When the receiving power detected by the RSSI module is greater than the third preset value, the interference suppression system 10 works regularly. It should be understood that the first preset value, second preset value, and third preset value can be set according to the actual conditions.

Figure 3:
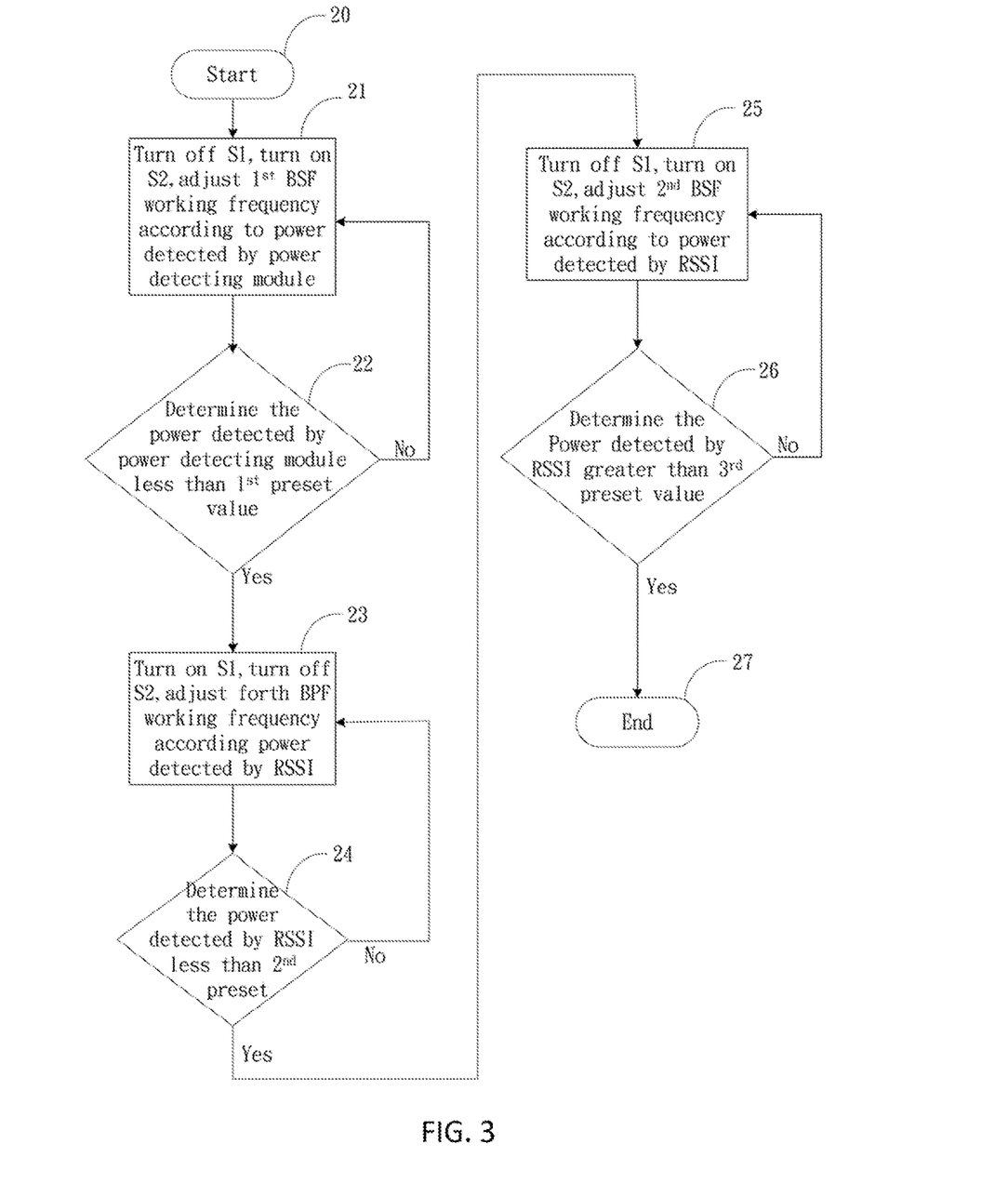
FIG. 3 is a flowchart showing an embodiment of a method for interference suppression.

FIG. 3 is a flowchart showing an embodiment of a method for interference suppression of the interference suppression system.

The method comprises the following steps:

Step S1: the base band module 1001 turns off the first switch S1 and turns on the second switch S2; and the power detecting module 1013 detects sending power of the RF sending channel 2. The base band module 1001 adjusts frequency band of the first BSF 1008 according to sending power detected by the power detecting module 1013.

Step S2: the base band module 1001 determines whether the sending power detected by the power detecting module 1013 is less than the first preset value, if it is, executes S3; and if not returns to S1.

Step S3: the base band module 1001 turns on the first switch S1 and turns off the second switch S2; the RSSI module detects sending power of RF sending channel 2; and the base band module 1001 adjusts frequency band of the fourth BPF 1010 according to the sending power detected by RSSI module.

Step S4: the base band module 1001 determines whether the sending power detected by the RSSI module is less than the second preset value, if it is, executes S5; and if not, returns to S3.

Step S5: the base band module 1001 turns off the first switch S1 and turns on the second switch S2; and the RSSI module detects receiving power of the RF receiving channel 3; and the base band module 1001 adjusts frequency band of the second BSF 1014.

Step S6: the base band module 1001 determines whether the receiving power detected by the RSSI module is greater than the third preset value, if it is, then executes S7; and if not, returns to S5.

Step S7: interference suppression system 10 ends calibration.

Figure 4:
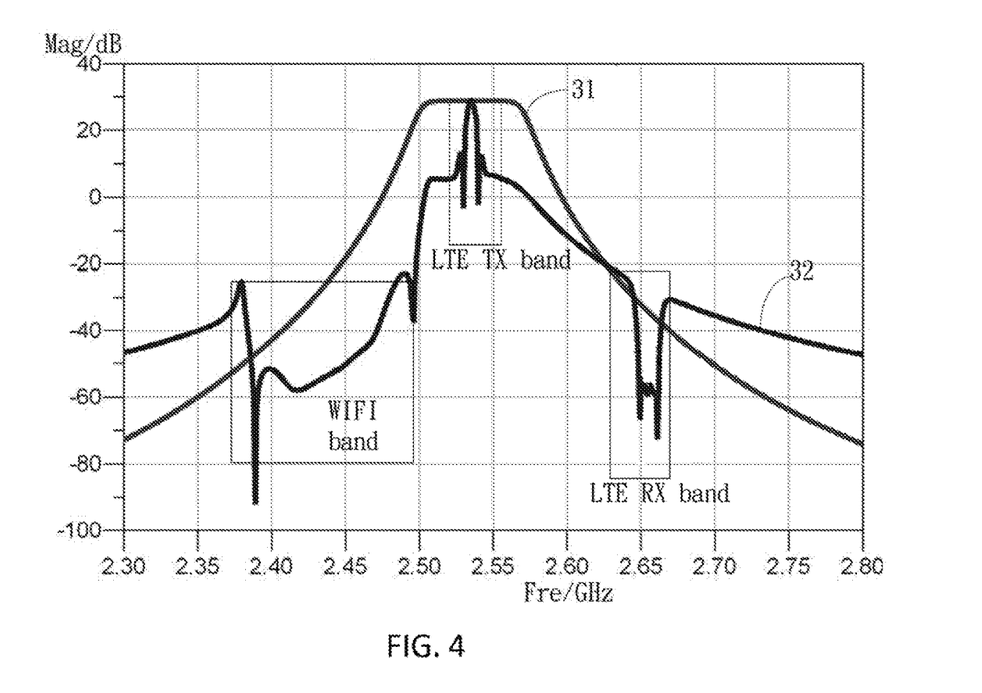
FIG. 4 is S21 parameter simulation diagram of an embodiment of the interference suppression system.

FIG. 4 is S21 parameter simulation diagram of an embodiment of the interference suppression system.

Curve 31 shows S21 parameter simulation of general systems hasn't employed interference suppression system 10, and curve 21 shows S21 parameter simulation of interference suppression system 10. General systems uses high order (at least 6) to filter interference, while interference suppress system 10 takes advantages of multiple adjustable filters, gain amplifiers and multiple feedbacks to reduce interference between LTE and WIFI and interference between LTE sending end and LTE receiving end. Because of gain amplifiers, the order of filters is reduced, in consequence, interference suppression system 10 can employ filters that order of filters not over 4. As shown in FIG. 4, interference suppression system 10 has better interference suppression capability than general systems in WIFI frequency band, LTE Tx frequency band and LTE Rx frequency band. To be specific, in WIFI frequency band, amplitude of S21 parameter has a larger decline says interference suppression system 10 reduces more interference compares to general systems. In adjacent band of LTE Tx band, amplitude of S21 parameter has a larger decline says interference suppression system 10 reduces more interference of RF sending channel 2 compares to general systems. In LTE Rx band, amplitude of S21 parameter has a larger decline says interference in RF receiving channel 3 has been reduced more than general systems.

The interference suppression system 10 takes multiple feedbacks to enhance suppression capability, and reduces interference from RF sending channel to RF receiving channel because of PCB signal leakage and interference between this system and adjacent systems. Serious filters set in feedback channels make forward transmission signal independent with filter characteristic, accordingly, output power consumption of PA has been reduced. Gain amplifiers set in feedback have largely enhanced interference suppression capability. What's more, power detecting module, RSSI module and adjustable filters decrease the order of filters. All above together make interference suppression system 10 achieves high sensitivity, high reliability and low cost.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Many details are often found in the art such as the other features of interference suppression system. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An interference suppression system comprising:
   an antenna;
   a control module;
   a receiving and sending module, coupled to the antenna;
   a radio frequency (RF) sending channel, coupled between the receiving and sending module and the control module;
   a power amplifier (PA), set in the RF sending channel, comprising a PA output end and a PA input end;
   a RF receiving channel, coupled between the receiving and sending module and the control module;
   a first filter module with a first band stop filter (BSF), comprising a first filter module input end coupled to the PA output end, a first filter module output end coupled to the PA input end, and a first filter control end coupled to the control module; and
   a power detecting module, coupled to the control module and the PA output end, configured to detect a first RF sending power outputted by the PA;
   wherein, the control module is configured to adjust a first filter module frequency band according to the first RF sending power outputted by the PA, resulting in the first filter module feeds back a signal to the PA input end; and when the control module determines the first RF sending power is greater than a first preset power, the control module continuously adjusts a first BSF frequency band until the first RF sending power is less than the first preset power.

2. The interference suppression system of claim 1, the receiving and sending module comprising an antenna transceiver switch.

3. The interference suppression system of claim 1, further comprising:
   a first switch, coupled between the RF receiving channel and the PA output end; and
   a second switch, set in the RF receiving channel, coupled to the control module.

4. The interference suppression system of claim 3, the first filter module comprising the first band stop filter (BSF), coupled to the PA input end and the control module, configured to filter interference out of a particular operating frequency band.

5. The interference suppression system of claim 3, the control module further comprising a received signal strength indicator (RSSI) module.

6. The interference suppression system of claim 4, wherein the control module turns on the second switch and turns off the first switch, and when the control module determines the first RF sending power is greater than a first preset power, the control module continuously adjusts a first BSF frequency band until the first RF sending power is less than the first preset power.

7. The interference suppression system of claim 5, further comprising a second filter module, coupled to the PA output end and the PA input end.

8. The interference suppression system of claim 5, further comprising a LNA (Low Noise Amplifier), with a LNA input end coupled to the receiving and sending module, and a LNA output end coupled to the second switch, the LNA input end.

9. The interference suppression system of claim 7, the second filter module comprising a third band pass filter (BPF) and a fourth BPF, the fourth BPF coupled to the control module.

10. The interference suppression system of claim 8, further comprising a third filter module, coupled to the LNA output end and the LNA input end.

11. The interference suppression system of claim 9, wherein the control module turns on the first switch and turns off the second switch, and the RSSI module detects a second RF sending power outputted by the PA, when the control module determines the second RF sending power is greater than a second preset power, the control module continuously adjusts a fourth BPF frequency band until the second RF sending power is less than the second preset power.

12. The interference suppression system of claim 10, the third filter module comprising a second BSF and fifth BPF, the second BSF coupled to the control module.

13. The interference suppression system of claim 11, the second filter module comprising a first amplifier coupled to the third BPF, the fourth BPF and the PA input end, and configured to amplify a third BPF output signal and a fourth BPF output signal.

14. The interference suppression system of claim 12, wherein the RSSI module is further configured to detect RF receiving power outputted by the LNA;
   the control module is further configured to adjust a second BSF frequency band according to the RF receiving power.

15. The interference suppression system of claim 14, wherein the control module turns off the first switch and turns on the second switch, when the control module determines the RF receiving power is less than a third preset power, the control module continuously adjusts the second BSF frequency band until the RF receiving power is greater than the third preset power.

16. The interference suppression system of claim 15, the third filter module further comprising a second amplifier coupled to the fifth BPF and the LNA input end, configured to amplify a fifth BPF output signal.

17. An interference suppression system comprising:
   an antenna;
   a control module;
   a receiving and sending module, coupled to the antenna;
   a radio frequency (RF) sending channel, coupled between the receiving and sending module and the control module;
   a power amplifier (PA), set in the RF sending channel, comprising a PA output end and a PA input end;
   a RF receiving channel, coupled between the receiving and sending module and the control module;

a first switch, coupled between the RF receiving channel and the PA output end;

a second switch, set in the RF receiving channel, coupled to the control module, a first filter module with a first band stop filter (BSF), comprising a first filter module input end coupled to the PA output end, a first filter module output end coupled to the PA input end, and a first filter control end coupled to the control module; and a power detecting module, coupled to the control module and the PA output end, configured to detect a first RF sending power outputted by the PA;

wherein, the control module is configured to adjust a first filter module frequency band according to the first RF sending power outputted by the PA, resulting in the first filter module feeds back a signal to the PA input end; and the control module turns on the second switch and turns off the first switch, and when the control module determines the first RF sending power is greater than a first preset power, the control module continuously adjusts a first BSF frequency band until the first RF sending power is less than the first preset power.

* * * * *

UNITED STATES PATENT AND TRADEMARK OFFICE
CERTIFICATE OF CORRECTION

PATENT NO.       : 10,069,576 B2
APPLICATION NO.  : 15/479239
DATED            : September 4, 2018
INVENTOR(S)      : Yang-Han Lee

Page 1 of 1

It is certified that error appears in the above-identified patent and that said Letters Patent is hereby corrected as shown below:

On the Title Page

Please replace Item (73) regarding "Assignees" with the following:
(73) Assignees: HONG FU JIN PRECISION INDUSTRY (Shenzhen) Co., LTD., Shenzhen (CN);
HON HAI PRECISION INDUSTRY Co., LTD., New Taipei (TW)

Signed and Sealed this
Thirty-first Day of December, 2019

Andrei Iancu
*Director of the United States Patent and Trademark Office*